United States Patent [19]

Secol et al.

[11] Patent Number: 5,226,013
[45] Date of Patent: Jul. 6, 1993

[54] BIAS AND PRECHARGING CIRCUIT FOR USE IN READING EPROM CELLS

[75] Inventors: Maurizio Secol, Legnano; Maurizio Gaibotti, Barlassina, both of Italy

[73] Assignee: SGS-Thomson Microelectronics s.r.l., Agrate Brianza, Italy

[21] Appl. No.: 771,860

[22] Filed: Oct. 8, 1991

Related U.S. Application Data

[63] Continuation of Ser. No. 632,621, Dec. 26, 1990, abandoned, which is a continuation of Ser. No. 274,885, Nov. 22, 1988, abandoned.

[30] Foreign Application Priority Data

Dec. 1, 1987 [IT] Italy .................. 22828 A/87

[51] Int. Cl.$^5$ .............................................. G11C 7/00
[52] U.S. Cl. .................. 365/203; 365/189.09; 365/210
[58] Field of Search ............. 365/203, 207, 208, 210, 365/185, 189.09

[56] References Cited

U.S. PATENT DOCUMENTS 4,289,982  9/1981  Smith .................. 307/463
4,713,797  12/1987  Morton et al. .................. 365/210 X

FOREIGN PATENT DOCUMENTS 0102485  3/1984  European Pat. Off. .

Primary Examiner—Andrew L. Sniezek
Attorney, Agent, or Firm—Sixbey, Friedman, Leedom & Ferguson

[57] ABSTRACT

The bias and precharging circuit comprises a bias part and a precharging part of the bit line together with a sensing amplifier operating by comparison of the voltage of the bit line and a dummy bit line. The precharging part includes components which turn off the bias and precharging parts as soon as the sensing amplifier has read the cell subjected to precharging. The bias part includes components for amplifying the voltage unbalance produced by bias between the bit line and the dummy bit line. It provides a current-mirror to cause said voltage unbalance independently of the precharging part.

7 Claims, 1 Drawing Sheet

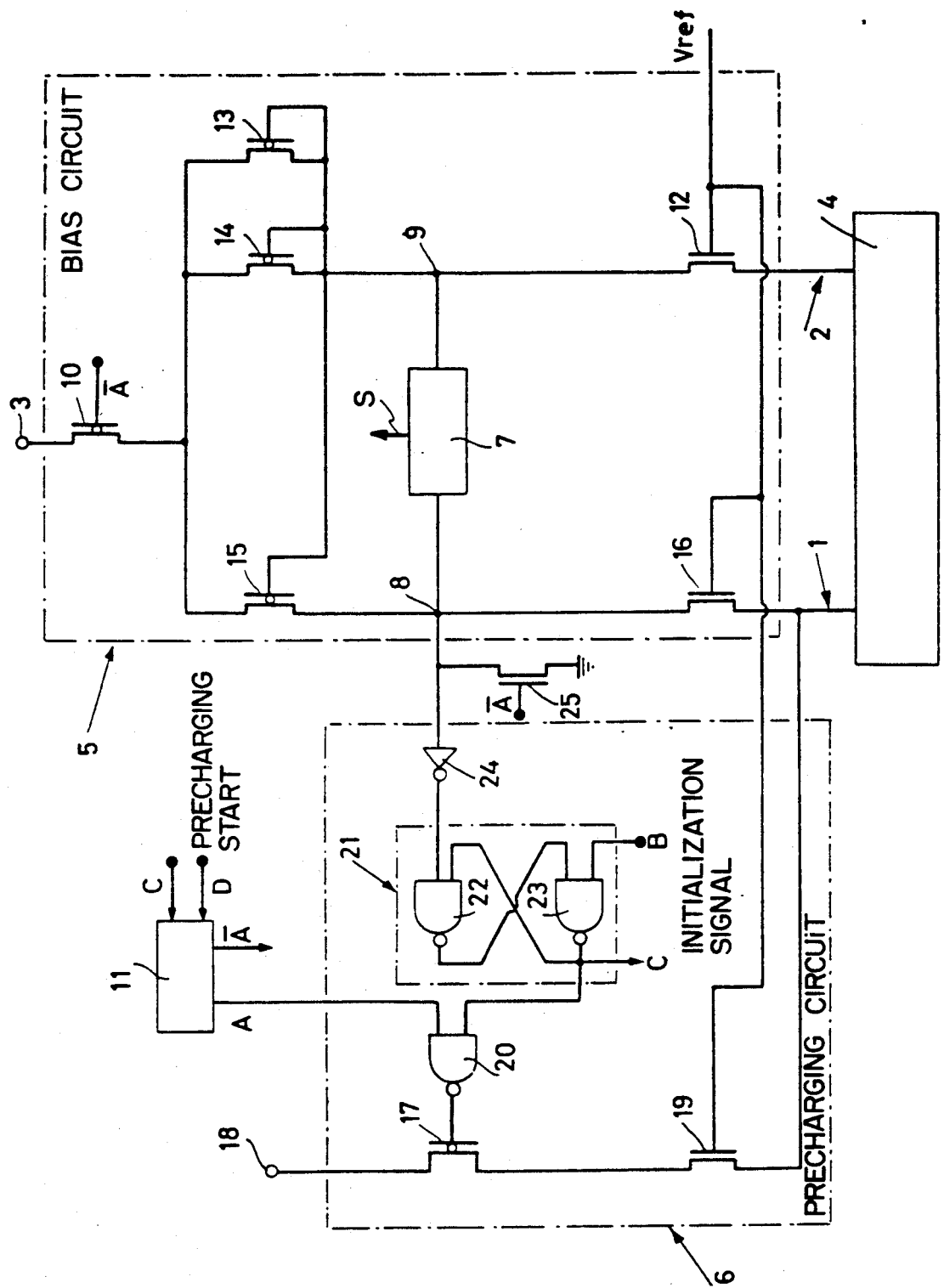

BIAS AND PRECHARGING CIRCUIT FOR USE IN READING EPROM CELLS

This application is a continuation of Ser. No. 07/632,631, filed Dec. 26, 1990, now abandoned, which was a continuation of Ser. No. 07/274,885, filed Nov. 22, 1988, now abandoned.

BACKGROUND OF THE INVENTION

The subject of the present invention is a bias and precharging circuit for a bit line of EPROM memory cells in CMOS technology.

Known circuits of this type used for reading cells of an EPROM memory cell matrix comprise a part designed for bias of the bit line and a part designed for fast precharging of said bit line. There is also provided a sensing amplifier operating by comparison of the voltage of said bit line with that of a dummy bit line connected to comparison memory cells never subjected to programming.

Said circuits are based on the principle that bias originates in the bit line a voltage which depends on the state of conduction of the cell being read and is thus unbalanced with that of the dummy bit line. The unbalance is sensed by the sensing amplifier, which converts it into a reading signal indicating the state of the cell being read. Precharging makes reading fast.

The principal drawbacks of the abovesaid circuits are represented at present by high current consumption and the need for a very sensitive and hence rather complicated sensing amplifier which would be capabale of sensing a rather small voltage unbalance at its ends.

SUMMARY OF THE INVENTION

The object of the present invention is to realize a bias and precharging circuit for a bit line of EPROM memory cells in CMOS technology free from the aforesaid drawbacks and specifically providing very small current consumption and allowing the use of a less sensitive and hence simpler sensing amplifier.

In accordance with the invention said object is achieved by a bias and precharging circuit which in the first place is characterized in that the precharging part comprises means for turning off the bias and precharging parts of the circuit as soon as the sensing amplifier has read the cell subjected to precharging.

The circuit in accordance with the invention is also characterized in that the bias part comprises a cascode amplification stage placed on the bit line to amplify the voltage unbalance caused by bias of a cell at the input of the sensing amplifier.

Finally the circuit in accordance with the invention is characterized in that the bias part comprises current-mirror means placed on the bit line and the dummy bit line to cause said voltage unbalance.

As a result current consumption of the circuit is clearly reduced due to the effect of turning off the precharging and bias parts of the circuit at the end of the time strictly necessary for the sensing amplifier to read the state of the cell.

At the same time amplification of the voltage unbalance by the cascode stage and use of a current mirror allow use of a less sensitive and hence simpler sensing amplifier.

BRIEF DESCRIPTION OF THE DRAWING

An example of a practical embodiment of the circuit in accordance with the invention is illustrated for greater clarity in the annexed drawing which shows the circuit diagram thereof.

DETAILED DESCRIPTION OF THE PREFERRED EMBODIMENTS

In the drawing reference numbers 1 and 2 indicate a bit line and a dummy bit line respectively which connect a voltage supply terminal 3 to an EPROM memory 4 with CMOS technology comprising in a known manner a matrix of memory cells selectable by means of a plurality of bit lines branching from the bit line 1 through a decoder and a plurality of word lines perpendicular to the bit lines as well as a plurality of comparison cells never subjected to programming to which is connected the dummy bit line 2.

With the lines 1 and 2 is associated a bias and precharging circuit made up of a bias part 5 and a fast precharging part 6. There is also provided a sensing amplifier 7 (which provides reading signal S) placed between respective intermediate circuit nodes 8 and 9 of the lines 1 and 2.

The bias part 5 is controlled through a P channel transistor 10 whose gate receives a control signal $\overline{A}$ which constitutes the negation of a control signal A for the precharging part 6, both signals being emitted by an appropriately controlled generator 11.

Said bias part comprises on the dummy line 2 between the memory 4 and the circuit node 9 an N channel transistor 12 with gate controlled by a reference voltage Vref while between the circuit node 9 and the control transistor 10 are placed in parallel two equal P channel transistors 13 and 14 with gate terminals connected to respective drain terminals. To said transistors 13 and 14 corresponds on the line 1, in current mirror configuration, an equal P channel transistor 15 with gate terminal connected to the common gate and drain terminals of the transistors 13 and 14. Between the circuit node 8 and the memory 4, again on the bit line 1, there is placed an N channel transistor 16 controlled by the reference voltage Vref and constituting a cascode amplification stage for the voltage unbalance which occurs between the two lines 1 and 2 in the reading phase.

The precharging part 6 comprises a P channel control transistor 17 placed between a supply terminal 18 and the memory 4 with an N channel transistor 19 in series and controlled by the reference voltage Vref. The gate of the transistor 17 is controlled by the output of an NAND logic port 20 which receives at one input the abovementioned control signal A and has another input connected to the output of a flip-flop 21 made up of two NAND logic elements 22 and 23. One input of the logic element 22 is connected to the circuit node 8 through an inverter 24. One input of the logic element 23 receives an initialization signal B. The output of said logic element 23 forms a signal C which acts on the generator 11 in such a manner as to switch the signals A and $\overline{A}$ to a logic level such as to turn off the precharging part 6 and the bias part 5 after reading by the sensing amplifier 7. An external signal D applied to the generator 11 is used to start precharging.

Between the circuit node 8 and ground there is placed an N channel transistor 25 with gate controlled by the signal $\overline{A}$.

In operation with the control transistor 10 in conduction the transistors 12, 13 and 14 bias the dummy bit line 2 at an appropriate voltage while the transistor 15 mirrors on the bit line 1 half of the current flowing in the dummy bit line 2. In this manner on the line 1 there is an unbalanced voltage with respect to that of the line 2 in a manner depending on the state of conduction of the cell being read. The transistor 16 constitutes as already mentioned a cascode circuit which amplifies the voltage unbalance at the input of the sensing amplifier 7.

Bit line 1 is biased rapidly using the precharging part 6. At the beginning the signal A is low so that $\overline{A}$ is high, the control transistors 10 and 17 are turned off and bias part 5 is not supplied. In addition the signal B has initialized the flip-flop 21 so as to send the signal C to high level. Reading is initiated by the signal D which takes A to high level and consequently $\overline{A}$ to low level. The signal A takes the transistor 17 into conduction while the signal $\overline{A}$ takes the transistor 10 into conduction. Therefore the bias part 5 is supplied through the transistor 10 and the bit line 1 is precharged by the precharging part 6 through the transistors 17 and 19 which are mutually in series. Precharging of the bit line 1 sends to high level the circuit node 8 which, through the inverter 24, switches the flip-flop 21 so as to turn off the transistor 17 and hence the precharging part 6. The signal C, which goes to low level, is then used to send A to low level and $\overline{A}$ to high level thus reducing to zero the consumption of the entire circuit after reading.

We claim:

1. A bit line bias and precharging circuit for reading an EPROM memory cell in CMOS technology arranged on a bit line with a parallel dummy bit line, comprising a bias part connected to the memory cell and a precharging part connected to the bias part, said bias part including:
   a sense amplifier having a first input, a second input and an output responsive to a voltage difference between said first and second input;
   first switch means connected to said bit line and said dummy bit line and activated by an external reading control input for feeding a first bias current to said dummy bit line, and consequently producing a first bias voltage at said first input of the sense amplifier, and for feeding a second bias current to said bit line and consequently producing a second bias voltage dependent on the state of the memory cell being read at said second input of the sense amplifier;
   wherein said precharging part includes second switch means likewise activated by said reading control input for connecting the bit line to a voltage supply to precharge the bit line at a precharged voltage value higher than a rest value thereof and means responsive to said precharged voltage value on said bit line to cause deactivation of said first and second switch means.

2. Circuit in accordance with claim 1, wherein said bias part comprises a cascode amplification stage placed on the bit line.

3. Circuit in accordance with claim 1, wherein said bias part comprises current-mirror means connected between the bit line and the dummy bit line to cause voltage unbalance between the two lines.

4. A bit line bias and precharging circuit for reading an EPROM memory cell having an associated first bit line and a second, dummy bit line parallel to the first bit line, with each of the first bit line and the dummy bit line having a sensing terminal, comprising:
   control signal generation means for generating, in response to external input signals, activating control signals indicating that the EPROM memory cell is to be precharged, said control signal generation means having a feedback control input and responding to a completion signal at said feedback control input to generate deactivating control signals indicating that the EPROM memory cell has been precharged;
   precharging circuit means connected to the control signal generating means, the feedback control input, and the first bit line sensing terminal, and responsive to the activating control signals to elevate a bias voltage at the first bit line sensing terminal and including means responsive to said elevated bias voltage value on said first bit line to generate said completion signal at said feedback control input;
   bias circuit means connected to the control signal generation means and to the first bit line and dummy bit line, responding to the activating control signals, for transmitting a first bias current signal to the dummy bit line and a second bias current signal to the first bit line to cause the first bit line terminal voltage to vary from the elevated bias voltage value depending on the state of the memory cell being read.

5. The bit line bias and precharging circuit of claim 4 wherein the bias circuit means comprises cascode amplifier means connected between the memory cell bit line and the first bit line sensing terminal for amplifying a state-indicating signal provided from the memory cell bit line for sensing at the first bit line sensing terminal.

6. The bit line bias and precharging circuit of claim 5 wherein the bias circuit means comprises current-mirror means connecting the sensing terminals of the first bit line and the dummy bit line.

7. The bit line bias and precharging circuit of claim 4 wherein the bias circuit means comprises current-mirror means connecting the sensing terminals of the first bit line and the dummy bit line.

* * * * *